(12) United States Patent
Imai

(10) Patent No.: US 9,991,438 B2
(45) Date of Patent: Jun. 5, 2018

(54) MAGNETOSTRICTIVE MEMBER AND MANUFACTURING METHOD THEREOF

(71) Applicant: NIPPON KOSHUHA STEEL Co., Ltd, Chiyoda-ku, Tokyo (JP)

(72) Inventor: Katsuya Imai, Imizu (JP)

(73) Assignee: NIPPON KOSHUHA STEEL Co., Ltd, Chiyoda-ku, Tokyo (JP)

( * ) Notice: Subject to any disclaimer, the term of this patent is extended or adjusted under 35 U.S.C. 154(b) by 0 days. days.

(21) Appl. No.: 15/649,649

(22) Filed: Jul. 14, 2017

(65) Prior Publication Data

US 2017/0317266 A1    Nov. 2, 2017

Related U.S. Application Data

(63) Continuation of application No. PCT/JP2015/054976, filed on Feb. 23, 2015.

(30) Foreign Application Priority Data

Jan. 29, 2015   (JP) .................................. 2015-015372

(51) Int. Cl.
*C30B 33/00* (2006.01)
*H01L 41/12* (2006.01)
(Continued)

(52) U.S. Cl.
CPC ............ *H01L 41/12* (2013.01); *C22C 38/002* (2013.01); *C30B 11/00* (2013.01); *C30B 29/52* (2013.01);
(Continued)

(58) Field of Classification Search
None
See application file for complete search history.

(56) References Cited

U.S. PATENT DOCUMENTS 4,609,402 A    9/1986 McMasters
5,529,745 A    6/1996 Mori et al.
(Continued)

FOREIGN PATENT DOCUMENTS

CN    102400034 A    4/2012
JP    H04-246151 A    9/1992
(Continued)

OTHER PUBLICATIONS

Clark et al. IEEE Transactions on Magnetics, 2000, vol. 36, p. 3238-3240.*
(Continued)

*Primary Examiner* — Xiaowei Su
(74) *Attorney, Agent, or Firm* — Yokoi & Co., U.S.A.; Toshiyuki Yokoi

(57) ABSTRACT

The present invention provides a magnetostrictive member with high performance, high reliability and high versatility. The magnetostrictive member is used in the vibration power generation as a power source for extracting electric energy from various vibrations. The member made of the single crystal is manufactured cheaper than the conventional manufacturing method. The magnetostrictive member is formed by cutting a single crystal of Fe—Ga alloy by using electric discharge machining in a state that <100> orientation of the crystal of the Fe—Ga alloy is aligned in a direction in which magnetostriction of the magnetostrictive member is required.

2 Claims, 5 Drawing Sheets

(51) Int. Cl.
    *C30B 29/52*     (2006.01)
    *C30B 11/00*     (2006.01)
    *C22C 38/00*     (2006.01)
    *H01L 41/20*     (2006.01)
    *H01L 41/47*     (2013.01)

(52) U.S. Cl.
    CPC .............. *H01L 41/20* (2013.01); *H01L 41/47* (2013.01); *C22C 2202/02* (2013.01)

(56) References Cited

U.S. PATENT DOCUMENTS

| | | | |
|---|---|---|---|
| 6,273,966 B1 | 8/2001 | Snodgrass et al. | |
| 8,092,616 B2 | 1/2012 | Furuya et al. | |
| 8,308,874 B1 | 11/2012 | Clark et al. | |
| 2003/0010405 A1* | 1/2003 | Clark | H01F 1/0306 148/108 |
| 2007/0183921 A1 | 8/2007 | Furuya et al. | |
| 2010/0006183 A1 | 1/2010 | Furuya et al. | |
| 2011/0192508 A1 | 8/2011 | Gao et al. | |
| 2017/0338752 A1* | 11/2017 | De Gersem | H02N 2/12 |

FOREIGN PATENT DOCUMENTS

| | | |
|---|---|---|
| JP | H06-2635 B | 1/1994 |
| JP | H07-100839 B | 11/1995 |
| JP | 2002-531701 A | 9/2002 |
| JP | 3452210 B | 7/2003 |
| JP | 2003-286550 A | 10/2003 |
| JP | 4814085 B | 9/2011 |
| JP | 2012-500333 A | 1/2012 |
| JP | 2012-076030 A | 4/2012 |
| JP | 2014-023368 A | 2/2014 |
| JP | 2014-84484 A | 5/2014 |
| JP | 2016-028831 A | 3/2016 |
| WO | 2005/087963 A | 9/2005 |

OTHER PUBLICATIONS

International Preliminary Report dated Mar. 31, 2017.
International Search Report for PCT/JP2015/054976 dated May 12, 2015.
Japanese notice of the reason for refusal dated Mar. 22, 2016.
Japanese decision of refusal dated Oct. 18, 2016.
Japanese decision to grant a patent dated Mar. 14, 2017.
Extended European Search Report dated Jan. 25, 2018.

* cited by examiner

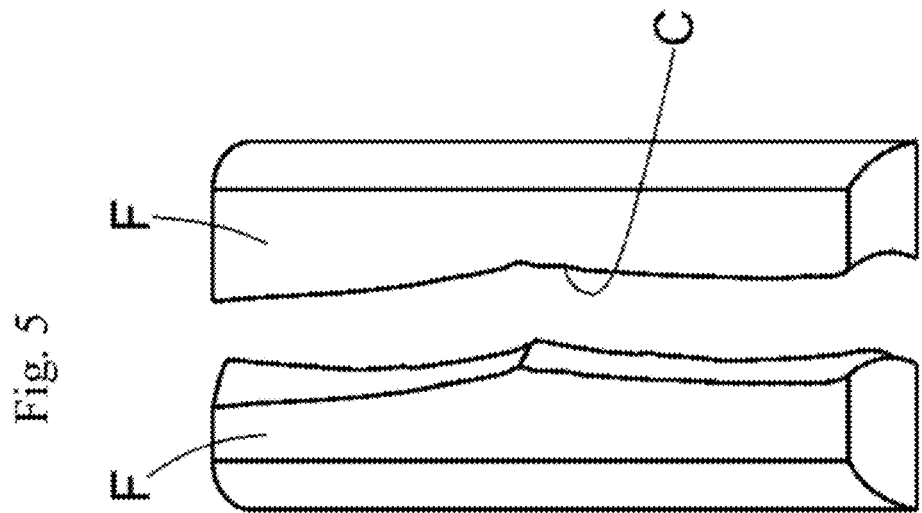

MAGNETOSTRICTIVE MEMBER AND MANUFACTURING METHOD THEREOF

CROSS-REFERENCES TO RELATED APPLICATIONS

This Application claims the benefit of priority and is a Continuation application of the prior International Patent Application No. PCT/JP2015/054976, with an international filing date of Feb. 23, 2015, which designated the United States, and is related to the Japanese Patent Application No. 2015-015372, filed Jan. 29, 2015, the entire disclosures of all applications are expressly incorporated by reference in their entirety herein.

BACKGROUND OF THE INVENTION

1. Field of the Invention

The present invention relates to a magnetostrictive member used for vibration power generation as a power source of an operation monitor of industrial machines such as a compressor and a power source of remote control switches of lighting devices, home electrical appliances, and automobiles and the like although these devices are conventionally operated by supplying a power from a battery. The present invention also relates to a manufacturing method of the magnetostrictive member.

2. Description of Related Art

As a super-magnetostrictive material, rare earth-transition metal magnetostrictive materials represented by Tb—Dy—Fe are known as shown in Japanese Examined Patent Publication No. H6-2635, Japanese Translation of PCT International Application Publication No. 2002-531701 and Japanese Examined Patent Publication No. H 7-100839. The magnetostriction of these kinds of magnetostrictive material exceeds 1000 ppm. This is extremely large compared to the magnetostriction: 30 ppm of permendur (Fe 50%-Co 50% alloy) and the magnetostriction: 70 ppm of magnetostrictive alloy Alfer (Fe 87%-Al 13%) which are known as the magnetostrictive material.

However, since the super-magnetostrictive material is made from rare earth-transition metal which is rare metal and expensive, the magnetostrictive material itself is very expensive. In addition, since the composition of the super-magnetostrictive material is Laves type intermetallic compound, the super-magnetostrictive material is extremely brittle and difficult to be processed into a required shape. Accordingly, the application field is limited and the devices using the super-magnetostrictive material are not widely spread.

On the other hand, the use of Fe—Ga based alloy is considered because the Fe—Ga based alloy is machinable and shows the magnetostriction of approximately 100 to 300 ppm although the magnetostriction is not as large as that of the Tb—Dy—Fe based material. The material used for the vibration power generation is practicable when the material has the magnetostriction of approximately 100 to 300 ppm. Thus, the Fe—Ga based alloy is preferable.

In the magnetostrictive materials such as the Tb—Dy—Fe based material and the Fe—Ga based alloy, the magnetostriction appears largely in the specific orientation of the crystal. Therefore, it is preferred that the material of the single crystal is used in a state that the orientation in which the magnetostriction of the crystal becomes the maximum is aligned with the direction in which the magnetostriction of the magnetostrictive member is required.

As the manufacturing method of the single crystal, the Bridgman method, the pulling method and the zone melting method can be listed. However, the productivity of the above-described manufacturing methods of the single crystal is considered to be extremely low. Thus, the examples of the powder metallurgy method (Japanese Patent No. 3452210), the manufacturing examples of alloy thin strips using the rapid solidification method (Japanese Patent No. 4053328), and the manufacturing method of pressure sintering the thin piece or the powdered material manufactured by the liquid rapid solidification method (Japanese Patent No. 4814085) are proposed. In addition, the method of manufacturing thin films by combining hot working and cold working shown in Japanese Translation of PCT International Application Publication No. 2012-500333 is proposed.

In all the above described various manufacturing methods, the member is made of polycrystal. Thus, it is impossible to align all orientations of the crystals of the member with the orientation in which the magnetostriction becomes the maximum. Accordingly, there is a problem that the magnetostrictive property is less than the member made of single crystal. In the manufacturing method of the alloy thin strips using the rapid solidification method and the manufacturing method of the thin films by combining hot working and cold working, only the thin strips and the thin films can be manufactured. Accordingly, there is a problem that the application range of the member is limited.

In the powder metallurgy method and the manufacturing method of pressure sintering the thin piece or the powdered material manufactured by the liquid rapid solidification method, special facilities such as an atomization facility, a liquid rapid solidification facility and a pressure sintering facility are required. Thus, the manufacturing cost is increased. In addition, special environment for preventing deterioration of the property caused by inclusion of foreign matter and impurities in the process of treating powder is required. It can also be the factor of increasing the manufacturing cost.

[Patent document 1] Japanese Examined Patent Publication No. H6-2635
[Patent document 2] Japanese Translation of PCT International Application Publication No. 2002-531701
[Patent document 3] Japanese Examined Patent Publication No. H 7-100839
[Patent document 4] Japanese Patent No. 3452210
[Patent document 5] Japanese Patent No. 4053328
[Patent document 6] Japanese Patent No. 4814085
[Patent document 7] Japanese Translation of PCT International Application Publication No. 2012-500333

BRIEF SUMMARY OF THE INVENTION

The present invention provides a magnetostrictive member with high performance, high reliability and high versatility. The magnetostrictive member is used in the vibration power generation as a power source for extracting electric energy from various vibrations. In order to obtain the best magnetostrictive property, the member made of the single crystal is manufactured cheaper than the conventional manufacturing method.

The invention described in claim 1 of the present invention is a magnetostrictive member formed by cutting a single crystal of Fe—Ga alloy by using electric discharge machining in a state that <100> orientation of the single crystal of the Fe—Ga alloy is aligned in a direction in which magnetostriction of the magnetostrictive member is required, wherein the single crystal of Fe—Ga alloy is formed by separating a steel ingot into an individual single crystal at a crystal grain boundary of the steel ingot, the steel ingot is formed of a plurality of coarse columnar crystals by using a unidirectional solidification method, the <100> orientation of the coarse columnar crystals is aligned in a longitudinal direction of the steel ingot, and a surface of the magnetostrictive member is shaped into a smooth surface by removing minute unevenness formed by the electric discharge machining using a polishing process without introducing strain on the magnetostrictive member.

The invention described in claim 2 of the present invention is the magnetostrictive member wherein a ratio of Ga in the Fe—Ga alloy is 19.0% to 23.0% by a mass ratio and the balance Fe and inevitable impurities.

The invention described in claim 3 of the present invention is the magnetostrictive member wherein an inclination between the direction in which magnetostriction of the magnetostrictive member is required and the <100> orientation of the crystal of the Fe—Ga alloy is 10.0° or less.

The invention described in claim 4 of the present invention is a manufacturing method of a magnetostrictive member, the method comprising: a unidirectionally solidifying step of retaining an Fe—Ga alloy in a furnace heated to a melting temperature or more for a predetermined time and then extracting the melted Fe—Ga alloy out of the furnace at a predetermined speed to unidirectionally solidify the melted Fe—Ga alloy; a first cutting step of cutting a solidified steel ingot obtained by the unidirectionally solidifying step into a strip shape after the unidirectionally solidifying step; a separating step of separating a strip shaped material obtained by the first cutting step into an individual single crystal at a crystal grain boundary; and a second cutting step of cutting the individual single crystal obtained by the separating step by using electric discharge machining in a state that <100> orientation of the individual single crystal is aligned in a direction in which magnetostriction of the magnetostrictive member is required. The invention described in claim 5 of the present invention is the manufacturing method of the magnetostrictive member wherein the predetermined speed is 20 mm/hour or less.

As explained above, the present invention comprises only of a step of manufacturing a unidirectionally solidified steel ingot by a simple and cheap melting/casting facility, a step of cutting the unidirectionally solidified steel ingot into a strip shape to separate the solidified steel ingot into an individual single crystal, and a step of cutting the separated single crystal into a required size and shape by using electric discharge machining. Accordingly, the magnetostrictive member with high performance, high reliability and high versatility can be manufactured at very low cost.

BRIEF DESCRIPTION OF THE DRAWINGS

FIG. 1A is a vertical cross-sectional view of the device showing a melting process. FIG. 1B is a vertical cross-sectional view of the device showing a unidirectionally solidifying process.

FIG. 5 is a front view of the single crystal separated into the individual columnar crystal in the cutting process.

DETAILED DESCRIPTION OF THE INVENTION

Figure 1A:
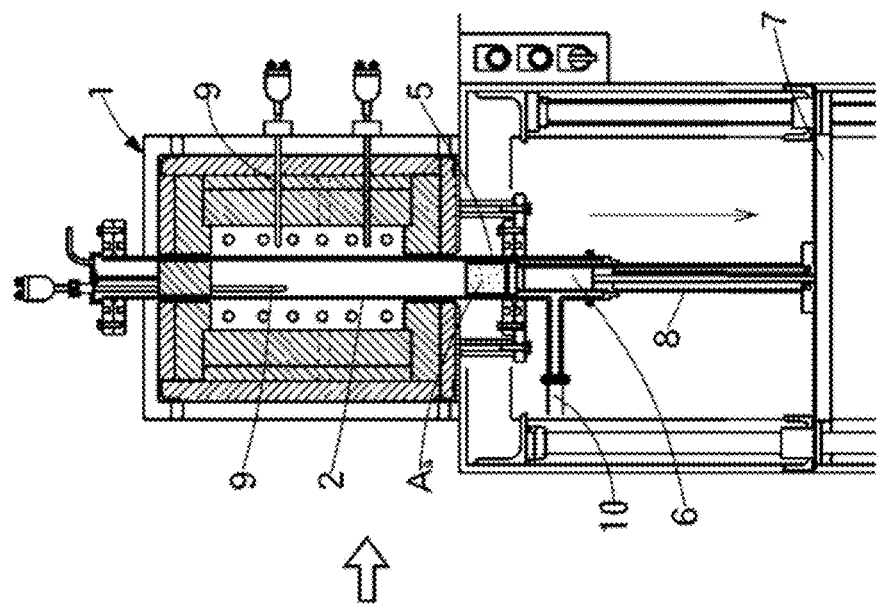
FIGS. 1A and 1B show a device used for melting a magnetostrictive alloy and unidirectionally solidifying the melted magnetostrictive alloy in the present invention.

Hereafter, the present invention will be explained in more detail by the using embodiments shown in the drawings.

Figure 1B:
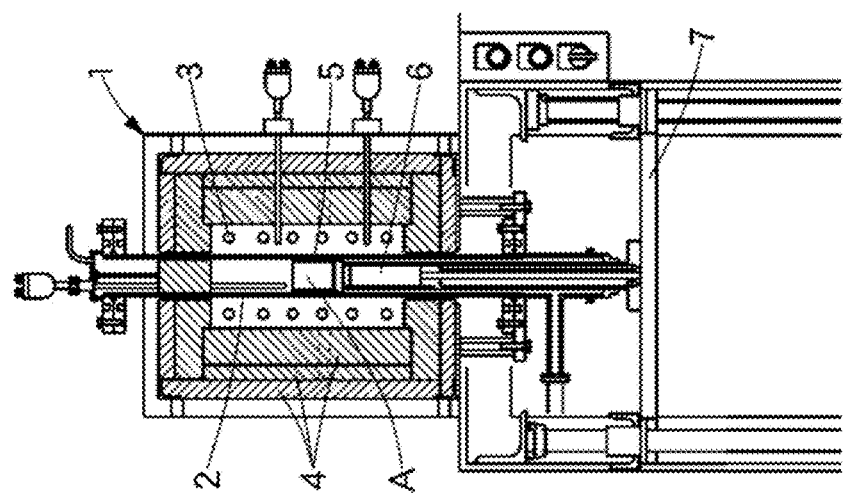

FIGS. 1A and 1B show a device for melting Fe—Ga alloy and unidirectionally solidifying the melted magnetostrictive alloy. "1" in FIGS. 1A and 1B is a tubular furnace. "2" is a furnace core tube vertically arranged at a center portion of the tubular furnace 1. A heater 3, which consists of an electric resistor, and an insulator 4 are arranged on an outer side of the furnace core tube 2 so as to surround the furnace core tube 2.

"5" is a crucible arranged in the furnace core tube 2 and placed on a crucible-supporting base 6. The crucible-supporting base 6 is configured to be vertically elevated and lowered by a lifting/lowering device 7 via a crucible-supporting rod 8. "9" is a thermocouple inserted inside and outside the furnace core tube 2, and "10" is a vacuum exhaust pipe. One end side of the vacuum exhaust pipe 10 is connected with a not illustrated vacuum pump and the other end side is connected with the furnace core tube 2. The inside of the furnace core tube 2 can be kept in a vacuum state or in an atmospheric state of various gasses by the vacuum pump.

In the tubular furnace 1 shown in FIGS. 1A and 1B, a magnetostrictive alloy material A is entered in the crucible 5 which is installed in the furnace core tube 2, the magnetostrictive alloy material A entered in the crucible 5 is heated by the heater 3 which is installed in the tubular furnace 1 to a melting temperature or more to melt the magnetostrictive alloy material A (shown in FIG. 1A). The melted magnetostrictive alloy material Aa is retained in the tubular furnace 1 for a predetermined time while the temperature of the furnace is kept constant. In this case, the temperature of the tubular furnace 1 should be kept constant but the temperature does not have to be controlled complicatedly.

After the melted magnetostrictive alloy material Aa is retained in the tubular furnace 1 for a predetermined time, the crucible-supporting base 6 is lowered by the lifting/lowering device 7 to extract the crucible 5 placed on the crucible-supporting base 6 and the melted magnetostrictive alloy material Aa in the crucible 5 gradually from the inside of the tubular furnace 1 to the outside of the tubular furnace 1 (shown in FIG. 1B).

Since the magnetostrictive alloy material Aa is gradually extracted to the lower side from the inside of the tubular furnace 1 to the outside of the tubular furnace 1 by the lifting/lowering device 7, the magnetostrictive alloy material Aa in the crucible 5 is unidirectionally solidified in a direction from the bottom to the top of the crucible 5. Because of this, crystal growth occurs in the <100> orientation, which is the orientation in which the magnetostriction becomes the maximum. Thus, columnar crystals in which the <100> orientation of the crystal is aligned in a longitudinal direction of the steel ingot can be obtained.

In addition, since the melted magnetostrictive alloy material Aa is extracted from the inside to the outside of the furnace at a speed slow enough, the magnetostrictive alloy material Aa is solidified at an extremely slow speed and coarse crystal grains can be obtained. The lowering speed of the material is preferably 20 mm/hour or less to obtain sufficiently coarse crystal grains. Note that the lowering speed of the material can be constant during the operation.

The present invention does not require fine control and mechanism that are conventionally required for manufacturing the single crystal. For example, conventionally, a temperature gradient should be formed in the furnace of the single crystal manufacturing device or the like, highly precise position control mechanism and control device for controlling the movement of the material is required depending on the growth of the crystal, an operation of making a seed crystal which controls an orientation of the growth of the crystal be in contact with a surface of molten metal is required in an early stage of the solidification, and a use of a crucible having a special shape for limiting nuclear growth is required. Thus, the mechanism can be simple and cheap in the present invention.

Figure 2A:
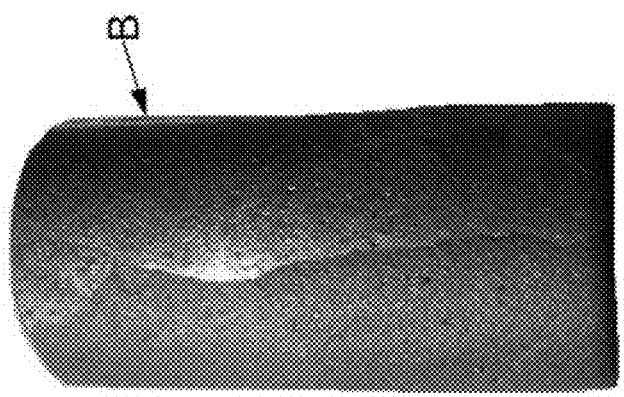
FIG. 2A is a front picture of the unidirectionally solidified steel ingot solidified by the device (shown in FIG. 1B) used in the present invention.
Figure 2B:
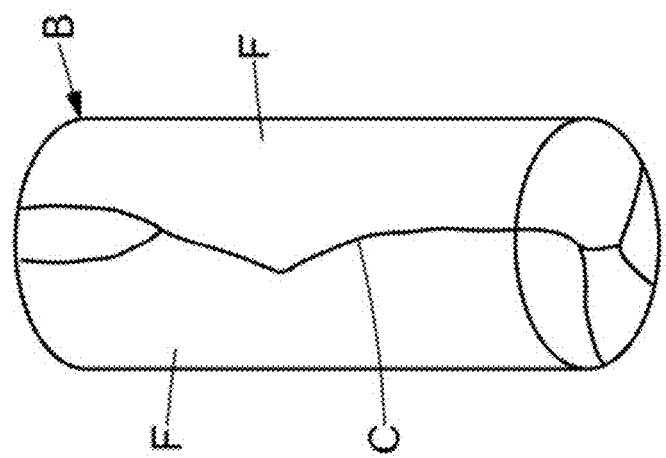
FIG. 2B is a front view of the solidified steel ingot.

FIGS. 2A and 2B show an outer appearance of a unidirectionally solidified steel ingot B which is made by melting the magnetostrictive alloy material A used in the present invention and unidirectionally solidifying the melted magnetostrictive alloy material Aa by the device shown in FIGS. 1A and 1B. FIG. 2A is a front picture of the unidirectionally solidified steel ingot B. FIG. 2B is a front view drawn for explaining the unidirectionally solidified steel ingot B. As shown in FIGS. 2A and 2B, the unidirectionally solidified steel ingot B is formed by several large columnar crystals F (each columnar crystal is a single crystal). In FIG. 2B, a line C that appears on the surface of the unidirectionally solidified steel ingot B is a crystal grain boundary.

Figure 3:
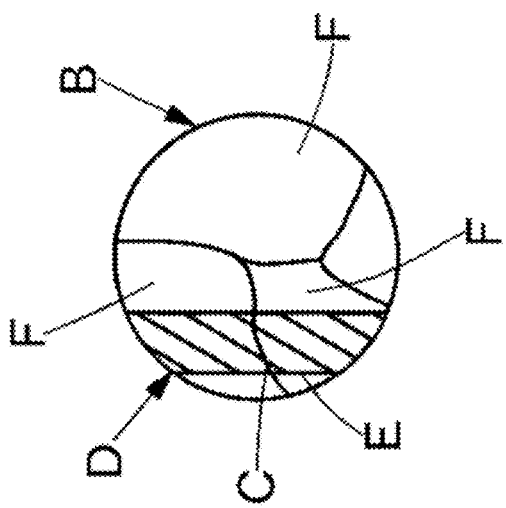
FIG. 3 is an explanatory drawing for cutting the unidirectionally solidified steel ingot shown in FIG. 2B into a strip shape at a hatched portion.
Figure 4:
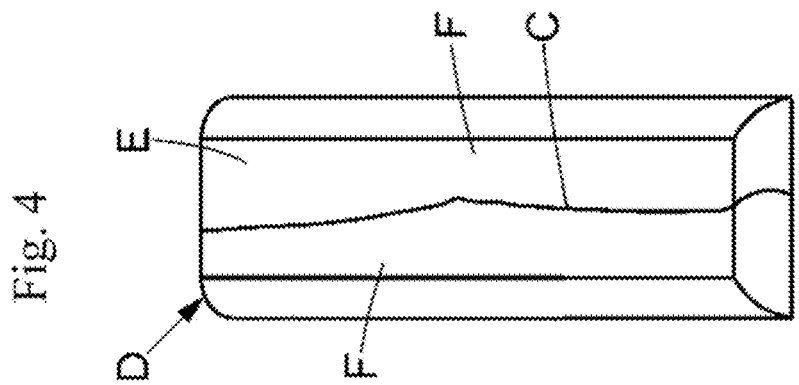
FIG. 4 is a front view of the portion cut into a strip shape seen from the cut surface side.

Then, the unidirectionally solidified steel ingot B is cut into a strip shape having a required size. For example, a strip-shaped portion D, which is a portion hatched by oblique lines in FIG. 3 (plan view of FIG. 2B), is cut from the unidirectionally solidified steel ingot B. FIG. 4 is a front view of the strip-shaped portion D cut into a strip shape seen from the cut surface E side. On the cut surface E, a boundary of the columnar crystals F, i.e., a crystal grain boundary C, can be seen.

The connection force of the crystal grain boundary C is extremely weak. Thus, the steel ingot B may be separated into the individual columnar crystal F in the cutting step as shown in FIG. 5, for example. Even if the crystal grain boundary C is connected in the cutting step, it can be easily separated into the columnar crystal F by with extremely low force (e.g., bent by hand or impact is slightly applied). Each of the individual columnar crystal F is a single crystal. The magnetostrictive member of the present invention can be obtained by cutting the separated individual single crystal F using electric discharge machining to align the <100> orientation of the crystal with a direction in which magnetostriction of the magnetostrictive member is required.

As explained above, the present invention comprises only of a step of manufacturing the unidirectionally solidified steel ingot B, a step of cutting the manufactured unidirectionally solidified steel ingot B into a strip-shaped portion D to be separated into the columnar crystal (single crystal) F, and a step of forming the magnetostrictive member having required size and shape from the cut columnar crystals F using electric discharge machining. Accordingly, the magnetostrictive member with extremely low cost, high performance, high reliability and high versatility can be obtained by a simple and cheap melting/casting facility.

Table 1 shows measurement results of a conventional material 1 that is only one commercially available Fe—Ga alloy sold in U.S.A., the Fe—Ga alloy of an example 1 of the present invention and a comparative example 1. A power generation device was produced by using the magnetostrictive member of the example 1, the conventional material 1 and the comparative example 1. Table 1 shows an amount of tip displacement of the device, a magnetic flux density change dB of the magnetostrictive member and a peak voltage of the power generation device when the power generation device was vibrated by a sine wave of the resonance frequency. Note that the magnetic flux density change dB of the magnetostrictive member is directly linked to the height of the peak voltage of the power generation device. Therefore, the performance of the magnetostrictive member is better when the magnetic flux density change dB is larger.

The magnetostrictive member used for the power generation device was made by cutting the columnar crystal F into a size of 2×0.5×11 mm by electric discharge machining. The comparative example 1 was a polycrystalline body of the columnar crystal. The magnetostrictive member of the example 1 and the comparative example 1 were cut from the single crystal. In Table 1, the orientation of crystal is an angle difference between the longitudinal direction of the magnetostrictive member and the <100> orientation of the crystal.

The Ga content of the magnetostrictive member of the example 1 was 19.73% that was lower than that of the conventional material 1. However, the generated voltage of the example 1 was almost same as that of the conventional material 1, and the ratio of the magnetic flux density change dB with respect to the amount of tip displacement was larger in the example 1 than the conventional material 1. Accordingly, the content of expensive and rare Ga could be extremely reduced in the example 1. Thus, great effect could be obtained. According to the study of the inventor and his associates, good property could be obtained when the Ga content was within the range of approximately 23.0% at an upper limit. Since Ga is expensive, the Ga content exceeding the above-described upper limit is not preferable.

Although the Ga content of the comparative example 1 was 19.73%, the comparative example 1 was made by inclining the longitudinal direction of the magnetostrictive member 12° with respect to the <100> orientation of the crystal when cutting from the single crystal. When the magnetostrictive member is industrially produced, the magnetostrictive member is cut in a state that the longitudinal direction of the magnetostrictive member is inclined to some extent with respect to the <100> orientation of the crystal as an error of the angle. However, it is found that the property of the magnetostrictive member is deteriorated significantly when the angle difference is 12° as shown in the comparative example 1. This angle dependency has never reported in the past, and revealed for the first time by the research of the inventor and his associates.

TABLE 1

| | Ga content [wt. %] | angle difference between longitudinal direction of magnetostrictive member and <100> orientation of crystal | magnetic flux density change dB [T] |
|---|---|---|---|
| example 1 | 19.73 | 0° | 1.13 |
| conventional material 1 | 22.19 | 0° | 1.23 |
| comparative example 1 | 19.73 | 12° | 0.33 |

TABLE 1-continued

|  | amount of tip displacement [mm] | magnetic flux density change dB/amount of tip displacement (T)/(mm) | peak voltage [V] |
|---|---|---|---|
| example 1 | 0.5 | 2.26 | 3.1 |
| conventional material 1 | 0.6 | 2.05 | 3.4 |
| comparative example 1 | 0.6 | 0.55 | 1.0 |

Then, the example 2 is shown in Table 2. The ratio of the magnetic flux density change dB with respect to the amount of tip displacement was different between the example 1 and the example 2. This is because the operation conditions such as a difference of the permanent magnet for giving a bias magnetic field to the magnetostrictive member in the power generation device were different. The Ga content of the magnetostrictive member of the example 2 was almost same as that of the conventional material 2. Although the longitudinal direction of the magnetostrictive member was inclined 4° with respect to the <100> orientation of the crystal, the magnetic flux density change dB obtained was far larger than that of the conventional material 2.

TABLE 2

|  | Ga content [wt. %] | angle difference between longitudinal direction of magnetostrictive member and <100> orientation of crystal | manufacturing method of magnetostrictive member |
|---|---|---|---|
| example 2 | 22.26 | 4° | electric discharge machining |
| conventional material 2 | 22.19 | 0° | electric discharge machining |
| comparative example 2 | 22.26 | 12° | electric discharge machining |
| comparative example 3 | 22.26 | 4° | electric discharge machining + cutting machining |

|  | magnetic flux density change dB [T] | amount of tip displacement (mm) | magnetic flux density change dB/amount of tip displacement (T)/(mm) |
|---|---|---|---|
| example 2 | 1.15 | 1.4 | 0.82 |
| conventional material 2 | 0.62 | 1.0 | 0.62 |
| comparative example 2 | 0.43 | 1.4 | 0.31 |
| comparative example 3 | 0.86 | 1.6 | 0.54 |

Although the Ga content of the comparative example 2 was almost same as the Ga content of the magnetostrictive member of the example 2 and the conventional material 2, the longitudinal direction of the magnetostrictive member was inclined 12° with respect to the <100> orientation of the crystal in the comparative example 2. Although the Ga content was almost same as the conventional material, the property of the magnetostrictive member was deteriorated significantly when the angle difference between the longitudinal direction of the magnetostrictive member and the <100> orientation of the crystal was 12°.

In the comparative example 3, the Ga content was same as the magnetostrictive member of the example 2 and the longitudinal direction of the magnetostrictive member was inclined 4° with respect to the <100> orientation of the crystal. However, the comparative example 3 was cut from the single crystal by using machining process commonly performed in many cases of working members. The magnetic flux density change dB of the comparative example 3 was lower than that of the example 2. Thus, the property (the magnetic flux density change dB) of the magnetostrictive member was deteriorated to the level similar to the conventional material 2.

Even when the longitudinal direction of the magnetostrictive member is aligned with the <100> orientation of the crystal, the Fe—Ga alloy is soft and therefore the surface of the magnetostrictive member is subjected to processing distortion during the machining process. Thus, the orientation of crystal is disturbed from the surface to the depth of approximately 0.05 mm and the property of the magnetostrictive member is deteriorated by the disturbance of the orientation of crystal. This influence of the processing distortion caused by the machining process has never reported in the past, and revealed for the first time by the research of the inventor and his associates.

When smoothly removing minute unevenness formed by the electric discharge machining from the surface of the magnetostrictive member cut by the electric discharge machining using a polishing process paying close attention so as not to introduce strain on the magnetostrictive member, the orientation of crystal is not disturbed on the surface. Thus, the property of the magnetostrictive member is not deteriorated and the magnetic flux density change dB is same as the magnetostrictive member of the example 2 shown in Table 2.

DESCRIPTION OF THE REFERENCE NUMERALS 1 tubular furnace
2 furnace core tube
3 heater
4 insulator
5 crucible
6 crucible-supporting base
7 lifting/lowering device 8 crucible-supporting rod
9 thermocouple
10 vacuum exhaust pipe
A magnetostrictive alloy material
Aa melted magnetostrictive alloy material
B unidirectionally solidified steel ingot
C crystal grain boundary
D strip-shaped portion
E cut surface
F columnar crystal (single crystal)

What is claimed is:

1. A manufacturing method of a magnetostrictive member, the method comprising:
    a unidirectionally solidifying step of retaining an Fe—Ga alloy in a furnace heated to a melting temperature or more for a predetermined time and then extracting the melted Fe—Ga alloy out of the furnace at a predetermined speed to unidirectionally solidify the melted Fe—Ga alloy;
    a first cutting step of cutting a solidified steel ingot obtained by the unidirectionally solidifying step into a strip shape after the unidirectionally solidifying step;
    a separating step of separating a strip shaped material obtained by the first cutting step into an individual single crystal at a crystal grain boundary; and
    a second cutting step of cutting the individual single crystal obtained by the separating step by using electric discharge machining.

2. The manufacturing method of the magnetostrictive member according to claim 1, wherein
    the predetermined speed is 20 mm/hour or less.

* * * * *